United States Patent
Jun (12)

(10) Patent No.: US 12,289,116 B2
(45) Date of Patent: Apr. 29, 2025

(54) ANALOG-TO-DIGITAL CONVERTING CIRCUIT USING AUTO-ZERO PERIOD OPTIMIZATION AND OPERATION METHOD THEREOF

(71) Applicant: Samsung Electronics Co., Ltd., Suwon-si (KR)

(72) Inventor: Jaehoon Jun, Suwon-si (KR)

(73) Assignee: SAMSUNG ELECTRONICS CO., LTD., Suwon-si (KR)

(\*) Notice: Subject to any disclaimer, the term of this patent is extended or adjusted under 35 U.S.C. 154(b) by 268 days.

(21) Appl. No.: 17/971,690

(22) Filed: Oct. 24, 2022

(65) Prior Publication Data

US 2023/0155596 A1 May 18, 2023

(30) Foreign Application Priority Data

Nov. 15, 2021 (KR) .................. 10-2021-0156902
Apr. 21, 2022 (KR) .................. 10-2022-0049493
Jun. 7, 2022 (KR) .................. 10-2022-0068855

(51) Int. Cl.
  *H03M 1/00* (2006.01)
  *H04N 25/75* (2023.01)

(52) U.S. Cl.
  CPC ............ *H03M 1/002* (2013.01); *H04N 25/75* (2023.01)

(58) Field of Classification Search
  CPC ........... H03F 2203/45534; H03F 3/087; H03F 3/45183; H03F 3/45475; H03M 1/002; H03M 1/123; H03M 1/1295; H03M 1/56; H04N 25/616; H04N 25/75; H04N 25/772
  See application file for complete search history.

(56) References Cited

U.S. PATENT DOCUMENTS

| | | | |
|---|---|---|---|
| 9,282,264 B2* | 3/2016 | Park | H03K 5/08 |
| 9,554,072 B2 | 1/2017 | Hidalgo et al. | |
| 10,491,845 B2 | 11/2019 | Nakahara | |
| 10,594,333 B1 | 3/2020 | Choo et al. | |
| 10,616,518 B2 | 4/2020 | Jung et al. | |
| 10,840,936 B2 | 11/2020 | Hasegawa et al. | |
| 11,363,231 B2* | 6/2022 | Kang | H04N 25/78 |
| 2003/0058728 A1* | 3/2003 | Tran | G11C 11/5621 |
| | | | 365/230.03 |
| 2009/0184236 A1 | 7/2009 | Kawaguchi et al. | |

(Continued)

FOREIGN PATENT DOCUMENTS

| | | |
|---|---|---|
| EP | 3657776 A1 | 5/2020 |
| JP | 2019146016 A | 8/2019 |

*Primary Examiner* — Antoinette T Spinks
(74) *Attorney, Agent, or Firm* — Muir Patent Law, PLLC

(57) ABSTRACT

A circuit includes a first amplifier that first compares a ramp signal and a reset signal of a pixel signal output from a pixel array in a first operation period, second compares the ramp signal and an image signal of the pixel signal in a second operation period, and generates a first output signal in the first and second operation periods based on first and second comparison results; and a second amplifier that charges a capacitor in response to a second auto-zero signal in a second auto-zero period, stops an operation of the second amplifier from a time point at which the second auto-zero period ends to a time point at which the first operation period starts, and generates a second output signal based on the first output signal in the first operation period and the second operation period.

20 Claims, 13 Drawing Sheets

(56) References Cited

U.S. PATENT DOCUMENTS

| | | | |
|---|---|---|---|
| 2014/0293104 A1 | 10/2014 | Tanaka et al. | |
| 2014/0293106 A1* | 10/2014 | Park | H03M 1/08 |
| | | | 348/308 |
| 2020/0186734 A1* | 6/2020 | Nagawa | H04N 25/76 |
| 2020/0228740 A1 | 7/2020 | Otaka | |
| 2020/0266785 A1 | 8/2020 | Jung et al. | |
| 2021/0134854 A1 | 5/2021 | Poikonen et al. | |
| 2023/0155602 A1* | 5/2023 | Jun | H03M 1/183 |
| | | | 341/155 |
| 2025/0088774 A1* | 3/2025 | Park | H04N 25/77 |

\* cited by examiner

ANALOG-TO-DIGITAL CONVERTING CIRCUIT USING AUTO-ZERO PERIOD OPTIMIZATION AND OPERATION METHOD THEREOF

CROSS-REFERENCE TO RELATED APPLICATIONS

This application claims priority under 35 U.S.C. § 119 to Korean Patent Application Nos. 10-2021-0156902 filed on Nov. 15, 2021, 10-2022-0049493 filed on Apr. 21, 2022, and 10-2022-0068855 filed on Jun. 7, 2022, in the Korean Intellectual Property Office, the disclosure of each of which is incorporated by reference herein in its entirety.

BACKGROUND

Embodiments of the present disclosure described herein relate to an analog-to-digital converter, and more particularly, relate to an analog-to-digital converting circuit using auto-zero period optimization and an operation method thereof.

Image sensors may include a charge coupled device (CCD) image sensor, a complementary metal-oxide semiconductor (CMOS) image sensor (CIS), etc. The CMOS image sensor may include pixels composed of CMOS transistors and converts light energy into an electrical signal by using a photoelectric conversion element (or device) included in each pixel. The CMOS image sensor obtains information about a captured/photographed image by using the electrical signal generated by each pixel.

An analog-to-digital converter (ADC) receives an analog input voltage and converts the received analog input voltage to a digital signal. The converted digital signal may be provided to other devices. The ADC may be used in various signal processing devices. As the performance of signal processing devices is improved, nowadays, an improved resolution for an analog signal is needed. As such, there is used an ADC capable of processing many signals within the same time or providing an improved resolution for each signal. However, the ADC causes an increase of power consumption. Accordingly, the power consumption of the ADC may be desired to be reduced.

SUMMARY

Embodiments of the present disclosure provide an analog-to-digital converting circuit capable of reducing power consumption by using auto-zero period optimization, an operation method thereof, and an image sensor including the same.

According to an embodiment, a circuit includes a first amplifier and a second amplifier. The first amplifier that equalizes voltage levels of input nodes and an output node of the first amplifier in response to a first auto-zero signal in a first auto-zero period, first compares a ramp signal and a reset signal of a pixel signal output from a pixel array in a first operation period, second compares the ramp signal and an image signal of the pixel signal in a second operation period after the first operation period, and generates a first output signal on the output node in the first and second operation periods based on first and second comparison results. The second amplifier that charges a capacitor in response to a second auto-zero signal in a second auto-zero period, stops an operation of the second amplifier from a time point at which the second auto-zero period ends to a time point at which the first operation period starts, and generates a second output signal based on the first output signal in the first operation period and the second operation period.

According to an embodiment, an operation method of an analog-to-digital converting circuit including a first amplifier and a second amplifier includes equalizing voltage levels of input nodes and output nodes of the first amplifier in response to a first auto-zero signal in a first auto-zero period, charging a capacitor of the second amplifier in response to a second auto-zero signal in a second auto-zero period, stopping an operation of the second amplifier from a time point at which the second auto-zero period ends to a time point at which the first operation period starts, generating a first output signal by comparing a ramp signal and a reset signal of a pixel signal output from a pixel array during the first operation period and comparing the ramp signal and an image signal of the pixel signal during a second operation period after the first operation period, and generating a second output signal based on the first output signal in the first and second operation periods.

According to an embodiment, an image sensor includes a pixel array that converts a light into an electrical signal to generate a pixel signal, a ramp signal generator that generates a ramp signal, and an analog-to-digital converting circuit that converts the pixel signal into a digital signal. The analog-to-digital converting circuit includes a first amplifier, a second amplifier, and a counter. The first amplifier that generates a first output signal by equalizing voltage levels of input nodes and output nodes of the first amplifier in response to a first auto-zero signal in a first auto-zero period, first comparing a ramp signal and a reset signal of a pixel signal output from a pixel array in a first operation period, and second comparing the ramp signal and an image signal of the pixel signal in a second operation period. The second amplifier that charges a capacitor in response to a second auto-zero signal in a second auto-zero period, to generate a second output signal based on the first output signal in the first operation period and the second operation period, and to stop an operation of the second amplifier from a time point at which the second auto-zero period ends to a time point at which the first operation period starts. The counter that counts pulses of the second output signal and to output a counting result as a digital signal.

According to an embodiment, a circuit which charges a capacitor in response to an auto-zero signal in an auto-zero period and generates an output signal in an operation period includes a first transistor that provides a power supply voltage to a first output node from which the output signal is output, a second transistor that is connected to the capacitor through a bias node and is turned on in response to the auto-zero signal, a current source that is connected to the first transistor through the first output node, is connected to the capacitor and the second transistor through the bias node, and generates a power current based on a voltage level of the bias node, which is maintained by the capacitor, and a third transistor that is connected to the first transistor, provides the power supply voltage to the first transistor, and is turned off in response to a power down signal such that an operation of the circuit is stopped.

BRIEF DESCRIPTION OF THE FIGURES

The above and other objects and features of the present disclosure will become apparent by describing in detail embodiments thereof with reference to the accompanying drawings.

DETAILED DESCRIPTION

Below, example embodiments of the present disclosure will be described in detail and clearly to such an extent that one skilled in the art easily carries out the present disclosure.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
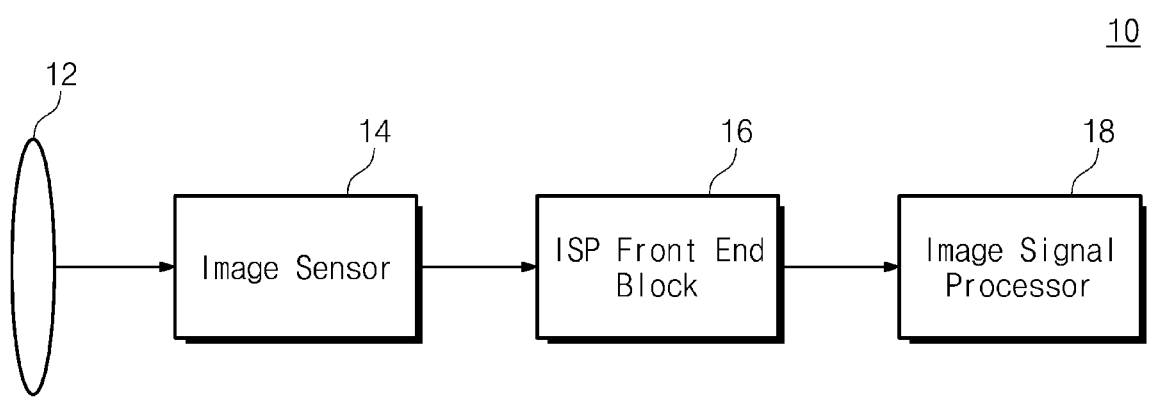
FIG. 1 illustrates an example of a configuration of an image processing block according to an embodiment of the present disclosure.

FIG. 1 illustrates an example of a configuration of an image processing block 10 according to an embodiment of the present disclosure. The image processing block 10 may be implemented as a part of various electronic devices such as a smartphone, a digital camera, a laptop computer, and a desktop computer. The image processing block 10 may include a lens 12, an image sensor 14, an image signal processor (ISP) front end block 16, and an image signal processor 18.

A light may be reflected by an object, a scenery, etc. targeted for photographing, and the lens 12 may receive the reflected light. The image sensor 14 may generate an electrical signal based on the light received through the lens 12. For example, the image sensor 14 may be implemented with a complementary metal-oxide semiconductor (CMOS) image sensor or the like. For example, the image sensor 14 may be a multi-pixel image sensor having a dual pixel structure or a tetracell structure.

The image sensor 14 may include a pixel array. Pixels of the pixel array may convert a light into electrical signals to generate pixel values or pixel signals. In addition, the image sensor 14 may include an analog-to-digital converting (ADC) circuit for performing correlated double sampling (CDS) on the pixel values. A configuration of the image sensor 14 will be described in detail with reference to FIG. 2.

The ISP front end block 16 may perform pre-processing on an electrical signal output from the image sensor 14 so as to be appropriate for processing of the image signal processor 18.

The image signal processor 18 may generate image data associated with the photographed object and scenery by appropriately processing the electrical signal processed by the ISP front end block 16. To this end, the image signal processor 18 may perform various processing operations such as color correction, auto white balance, gamma correction, color saturation correction, formatting, bad pixel correction, and hue correction.

One lens 12 and one image sensor 14 are illustrated in FIG. 1. However, in other embodiments, the image processing block 10 may include a plurality of lenses, a plurality of image sensors, and a plurality of ISP front end blocks. In this case, the plurality of lenses may have different fields of view. Also, the plurality of image sensors may have different functions, different performances, and/or different characteristics, and may respectively include pixel arrays of different configurations.

Figure 2:
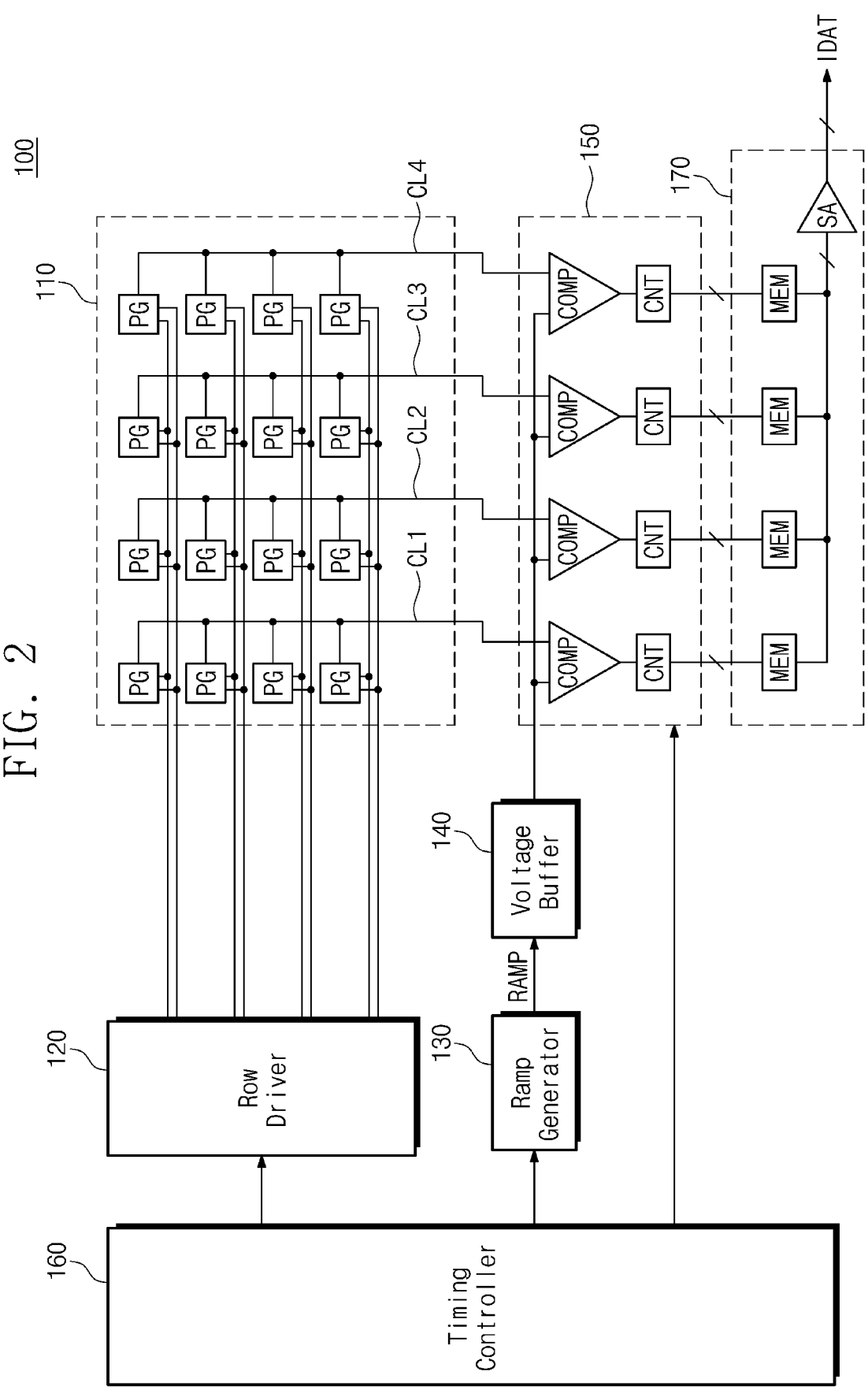
FIG. 2 illustrates an example of a configuration of an image sensor of FIG. 1 according to example embodiments.

FIG. 2 illustrates an example of a configuration of the image sensor 14 of FIG. 1 according to example embodiments. An image sensor 100 may include a pixel array 110, a row driver 120, a ramp signal generator 130, a voltage buffer 140, an ADC circuit 150, a timing controller 160, and a buffer 170.

The pixel array 110 may include a plurality of pixels arranged in the form of a matrix, that is, arranged along rows and columns. Each of the plurality of pixels may include a photoelectric conversion element (or device). For example, the photoelectric conversion element may include a photo diode, a photo transistor, a photo gate, a pinned photo diode, or the like.

The pixel array 110 may include a plurality of pixel groups PG. Each pixel group PG may include two or more pixels, that is, a plurality of pixels. Herein, for convenience of description, the terms of the plurality of pixel groups PG and a pixel group PG may be used interchangeably. A plurality of pixels constituting the pixel group PG may share one floating diffusion region or a plurality of floating diffusion regions. An example in which the pixel array 110 includes the pixel groups PG arranged in the form of a matrix with four rows and four columns (i.e., includes 4×4 pixel groups PG) is illustrated in FIG. 2. However, the present disclosure is not limited thereto.

The pixel group PG may include pixels of the same color. For example, the pixel group PG may include a red pixel to convert a light of a red spectrum into an electrical signal, a green pixel to convert a light of a green spectrum into an electrical signal, or a blue pixel to convert a light of a blue spectrum into an electrical signal. For example, the pixels constituting the pixel array 110 may be arranged in the form of a tetra-Bayer pattern.

The pixels of the pixel array 110 may output pixel signals through column lines CL1 to CL4, depending on the intensity or the amount of light received from the outside. For example, the pixel signal may be an analog signal corresponding to the intensity or the amount of light received from the outside. The pixel signals may pass through voltage buffers (e.g., source followers) and may then be provided to the ADC circuit 150 through the column lines CL1 to CL4.

The row driver 120 may select and drive a row of the pixel array 110. The row driver 120 may decode an address and/or a control signal generated by the timing controller 160 and may generate control signals for selecting and driving a row of the pixel array 110. For example, the control signals may include a signal for selecting a pixel, a signal for resetting a floating diffusion region, etc.

The ramp signal generator 130 may generate a ramp signal RAMP under control of the timing controller 160. For example, the ramp signal generator 130 may operate in response to a control signal such as a ramp enable signal. When the ramp enable signal is activated, the ramp signal generator 130 may generate the ramp signal RAMP depending on preset values (e.g., a start level, an end level, and a slope). In other words, the ramp signal RAMP may be a signal that increases or decreases along a preset slope during a specific time. The ramp signal RAMP may be provided to the ADC circuit 150 through the voltage buffer 140.

The ADC circuit 150 may receive pixel signals from a plurality of pixels through the column lines CL1 to CL4, and may receive the ramp signal RAMP from the ramp signal generator 130 through the voltage buffer 140. The ADC circuit 150 may operate based on a correlated double sampling (CDS) technique for obtaining a reset signal and an image signal from the received pixel signal and extracting a difference between the reset signal and the image signal as an effective signal component. The ADC circuit 150 may include a plurality of comparators COMP and a plurality of counters CNT.

In detail, each of the comparators COMP may compare the reset signal of the pixel signal and the ramp signal RAMP, may compare the image signal of the pixel signal and the ramp signal RAMP, and may perform correlated double sampling (CDS) on comparison results. Each of the counters CNT may count pulses of the signal experiencing the correlated double sampling and may output a counting result as a digital signal. Also, the ADC circuit 150 of the present disclosure may be implemented to reduce power consumption by using auto-zero period optimization and/or output feedback. An example in which the ADC circuit 150 includes four comparators COMP and four counters CNT is illustrated in FIG. 2, but the present disclosure is not limited thereto.

The timing controller 160 may generate a control signal and/or a clock for controlling an operation and/or a timing of each of the row driver 120, the ramp signal generator 130, and the ADC circuit 150.

The buffer 170 may include memories MEM and a sense amplifier SA. The memories MEM may store digital signals output from the corresponding counters CNT of the ADC circuit 150. The sense amplifier SA may sense and amplify the digital signals stored in the memories MEM. The sense amplifier SA may output the amplified digital signals as image data IDAT, and the image data IDAT may be provided to the ISP front end block 16 of FIG. 1.

Figure 3:
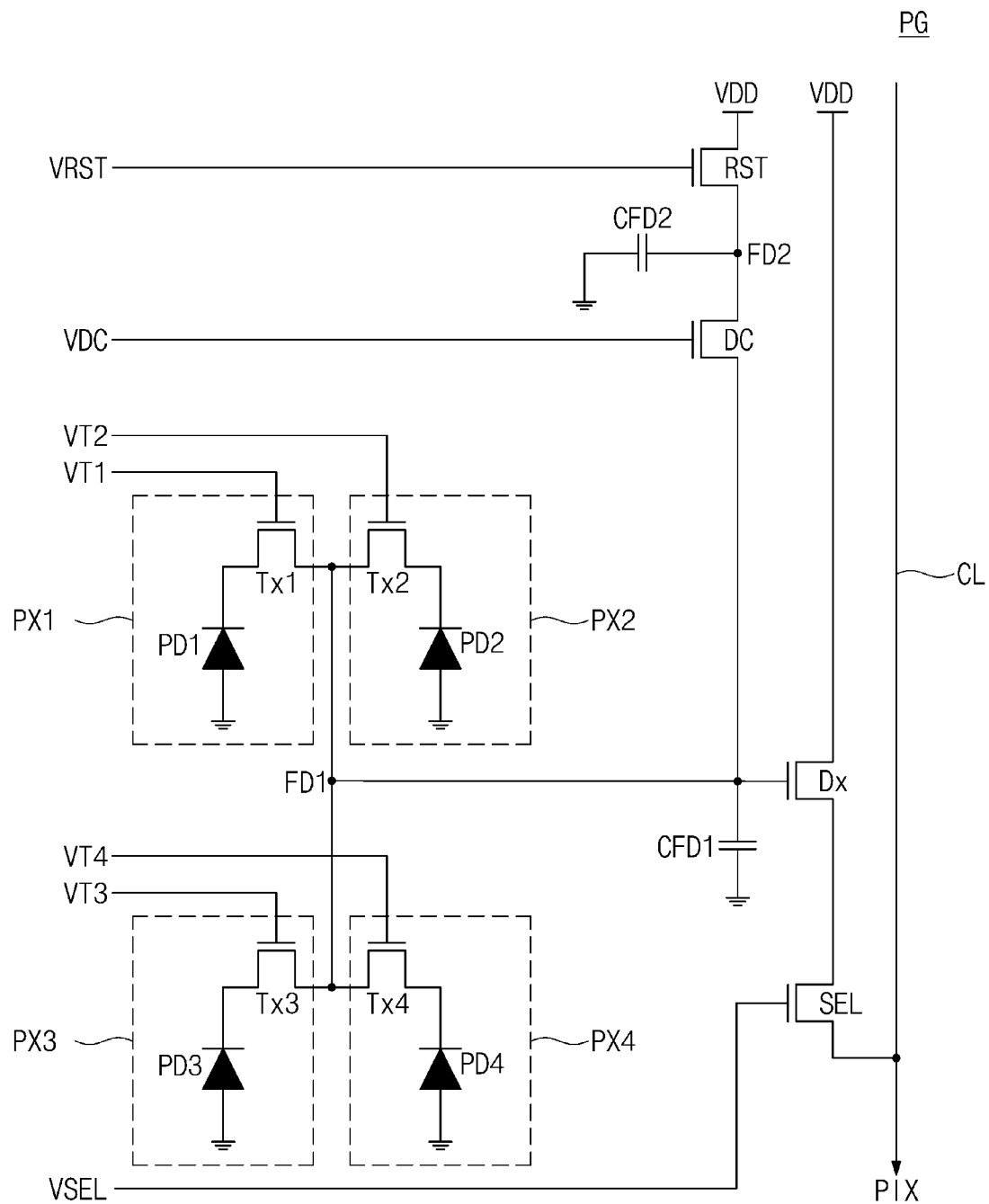
FIG. 3 is a circuit diagram illustrating an example of one among pixel groups of a pixel array of FIG. 2 according to example embodiments.

FIG. 3 is a circuit diagram illustrating an example of one of the pixel groups PG of the pixel array 110 of FIG. 2 according to example embodiments. For example, the pixel group PG may include pixels PX1 to PX4, photoelectric conversion elements PD1 to PD4, transfer transistors Tx1 to Tx4, a reset transistor RST, a dual conversion transistor DC, a drive transistor Dx, and a select transistor SEL. An example in which the pixel group PG has a tetracell structure in which four pixels PX1 to PX4 respectively include photoelectric conversion elements PD1 to PD4 is illustrated in FIG. 3, but the present disclosure is not limited thereto. For example, the pixel group PG may be implemented to have various different structures.

The first pixel PX1 may include the first photoelectric conversion element PD1 and the first transfer transistor Tx1, and each of the remaining pixels PX2, PX3, and PX4 may also include similar components/elements. The pixels PX1 to PX4 may share the reset transistor RST, the dual conversion transistor DC, the drive transistor Dx, and the select transistor SEL. Also, the pixels PX1 to PX4 may share a first floating diffusion region FD1. The reset transistor RST and the dual conversion transistor DC may share a second floating diffusion region FD2.

The first floating diffusion region FD1 or the second floating diffusion region FD2 may accumulate (or integrate) charges corresponding to the amount of incident light. While the transfer transistors Tx1 to Tx4 are respectively turned on by transfer signals VT1 to VT4, the first floating diffusion region FD1 or the second floating diffusion region FD2 may accumulate (or integrate) charges supplied from the photoelectric conversion elements PD1 to PD4. Because the first floating diffusion region FD1 is connected to a gate terminal of the drive transistor Dx operating as a source follower amplifier, a voltage corresponding to the charges accumulated at the first floating diffusion region FD1 may be formed. For example, a capacitance of the first floating diffusion region FD1 is depicted as a first capacitance CFD1.

The dual conversion transistor DC may be driven by a dual conversion signal VDC. When the dual conversion transistor DC is turned off, the capacitance of the first floating diffusion region FD1 may correspond to the first capacitance CFD1. In a general environment, because the first floating diffusion region FD1 is not easily saturated, there is no need to increase the capacitance (i.e., CFD1) of the first floating diffusion region FD1. In this case, the dual conversion transistor DC may be turned off.

However, in a high-luminance environment, the first floating diffusion region FD1 may be easily saturated. To prevent the saturation, the dual conversion transistor DC may be turned on such that the first floating diffusion region FD1 and the second floating diffusion region FD2 are electrically connected. In this case, a capacitance of the floating diffusion regions FD1 and FD2 may be increased to a sum of the first capacitance CFD1 and a second capacitance CFD2.

The transfer transistors Tx1 to Tx4 may be respectively driven by the transfer signals VT1 to VT4, and may transfer charges generated (or integrated) by the photoelectric conversion elements PD1 to PD4 to the first floating diffusion region FD1 or the second floating diffusion region FD2. For example, first ends of the transfer transistors Tx1 to Tx4 may be respectively connected to the photoelectric conversion elements PD1 to PD4, and second ends thereof may be connected in common to the first floating diffusion region FD1.

The reset transistor RST may be driven by a reset signal VRST and may provide a power supply voltage VDD to the first floating diffusion region FD1 or the second floating diffusion region FD2. As such, the charges accumulated in the first floating diffusion region FD1 or the second floating diffusion region FD2 may move to a terminal for the power supply voltage VDD, and a voltage of the first floating diffusion region FD1 or the second floating diffusion region FD2 may be reset.

The drive transistor Dx may amplify a voltage of the first floating diffusion region FD1 or the second floating diffusion region FD2 and may generate a pixel signal PIX corresponding to a result of the amplification. The select transistor SEL may be driven by a selection signal VSEL and may select pixels to be read in units of row. When the select transistor SEL is turned on, the pixel signal PIX may be output to the ADC circuit 150 of FIG. 2 through a column line CL.

Figure 4:
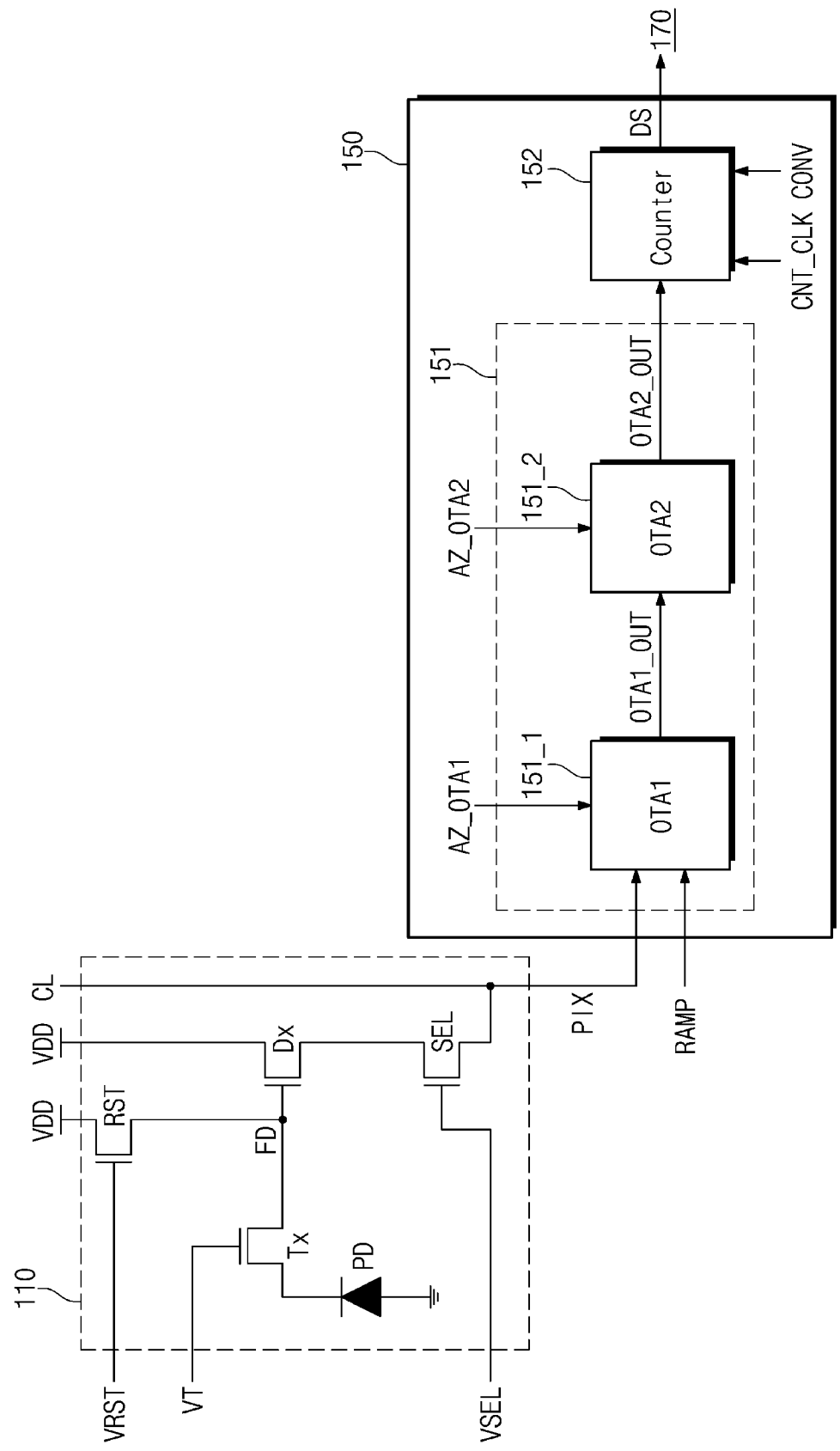
FIG. 4 illustrates an example of a configuration of an analog-to-digital converting circuit of FIG. 2 according to example embodiments.

FIG. 4 illustrates an example of a configuration of the analog-to-digital converting (ADC) circuit 150 of FIG. 2 according to example embodiments. The ADC circuit 150 may include a comparator 151 and a counter 152. The ADC circuit 150 may convert and output the pixel signal PIX being an analog signal output from the pixel array 110 into a digital signal DS. For the clearness of description and the brevity of drawing, an example in which the pixel array 110 includes only one pixel is illustrated in FIG. 4, and the configuration and function of the pixel array 110 are identical to those described with reference to FIG. 3.

In detail, as described with reference to FIG. 2, the comparator 151 may compare a reset signal of a pixel signal and the ramp signal RAMP, may compare an image signal of the pixel signal and the ramp signal RAMP, and may perform correlated double sampling (CDS) on comparison results, and the counter 152 may count pulses of a signal experiencing the correlated double sampling (CDS) and may output a counting result as a digital signal. FIG. 4 will be described with reference to FIGS. 2 and 3. Herein, the reset signal of a pixel signal may represent a signal of a pixel before receiving a reflected light and the image signal of the pixel signal may represent a signal of the pixel after receiving the reflected light.

For example, the comparator 151 may have a two-stage structure including two amplifiers (i.e., a first amplifier 151_1 and a second amplifier 151_2), and each of the first amplifier 151_1 and the second amplifier 151_2 may be implemented as an operational transconductance amplifier (OTA). However, the present disclosure is not limited thereto. For example, the comparator 151 may have a structure including three or more amplifiers. Also, the ADC circuit 150 may include a plurality of comparators and a plurality of counters, but one comparator 151 and one counter 152 are illustrated in FIG. 4 for the clearness of description.

The first amplifier 151_1 may receive the pixel signal PIX from the pixel array 110 through the column line CL, and may receive the ramp signal RAMP from the ramp signal generator 130 through the voltage buffer 140. The first amplifier 151_1 may output a first output signal OTA1_OUT based on the received signals. For example, in a period where a level of the ramp signal RAMP is higher than a level of the pixel signal PIX, the first amplifier 151_1 may output the first output signal OTA1_OUT having a high level, and in a period where the level of the ramp signal RAMP is lower than the level of the pixel signal PIX, the first amplifier 151_1 may output the first output signal OTA1_OUT having a low level. Also, the comparison operation of the first amplifier 151_1 described above may be performed both when the reset signal of the pixel signal PIX and the ramp signal RAMP are compared and when the image signal of the pixel signal PIX and the ramp signal RAMP are compared.

The second amplifier 151_2 may amplify the first output signal OTA1_OUT and may output a second output signal OTA2_OUT being a comparison signal. For example, the second output signal OTA2_OUT may be an inverted version of the first output signal OTA1_OUT. In other words, the second amplifier 151_2 may output the second output signal OTA2_OUT having a low level during the high level of the first output signal OTA1_OUT and may output the second output signal OTA2_OUT having a high level during the low level of the first output signal OTA1_OUT.

In the following description, that a voltage level of the first output signal OTA1_OUT or the second output signal OTA2_OUT transitions from the high level to the low level or from the low level to the high level as the comparator 151 performs the comparison operation may be referred to as "decision of the ADC circuit 150". In other words, "after the decision of the ADC circuit 150 ends" may mean "after a voltage level of the first output signal OTA1_OUT or the second output signal OTA2_OUT changes from the high level to the low level or from the low level to the high level".

In an auto-zero period before the comparison operation is performed, the comparator 151 may be initialized in response to an auto-zero signal and may then again perform the comparison operation. In detail, the first amplifier 151_1 may be initialized in response to a first auto-zero signal AZ_OTA1, and the second amplifier 151_2 may be initialized in response to a second auto-zero signal AZ_OTA2.

In the following description, an auto-zero period of the first amplifier 151_1 is referred to as a "first auto-zero period", and an auto-zero period of the second amplifier 151_2 is referred to as a "second auto-zero period". For example, during the first auto-zero period and the second auto-zero period, voltage levels of input nodes and/or output nodes of the first amplifier 151_1 and the second amplifier 151_2 may be equalized.

Also, a time taken to initialize the first amplifier 151_1 and a time taken to initialize the second amplifier 151_2 may be different from each other. For example, the time taken to initialize the first amplifier 151_1 may be longer than the time taken to initialize the second amplifier 151_2. In this case, when the second amplifier 151_2 is completely initialized, it is unnecessary to apply the second auto-zero signal AZ_OTA2 to the second amplifier 151_2.

In other words, when the initialization of the second amplifier 151_2 is completed before the initialization of the first amplifier 151_1, the second auto-zero period may be adjusted to be terminated, regardless of the remaining length of the first auto-zero period. For example, the second auto-zero period of the present disclosure may be optimized to be terminated at a time when the initialization of the second amplifier 151_2 is completed. For example, the second amplifier 151_2 may be implemented such that, when the second auto-zero period ends, a power is not consumed until the comparison operation of the first amplifier 151_1 is performed. To this end, the second amplifier 151_2 may include a switch for temporarily preventing power consumption in response to that the second auto-zero period ends. As such, the power consumption of the ADC circuit 150 may decrease through the auto-zero period optimization.

The counter 152 may operate under control of the timing controller 160, may count pulses of the second output signal OTA2_OUT, and may output a counting result as the digital signal DS. For example, the counter 152 may operate in response to control signals such as a counter clock signal CNT_CLK and an inversion signal CONV for inverting an internal bit of the counter 152.

For example, the counter 152 may include an up/down counter, a bit-wise inversion counter, etc. An operation of the bit-wise inversion counter may be similar to an operation of the up/down counter. For example, the bit-wise inversion counter may perform a function of performing up-counting only and a function of converting all internal bits of a counter to obtain the 1's complement when a specific signal is input thereto. The bit-wise inversion counter may perform a reset count operation and may then invert a reset counting result so as to be converted into the 1's complement, that is, a negative value.

Figure 5:
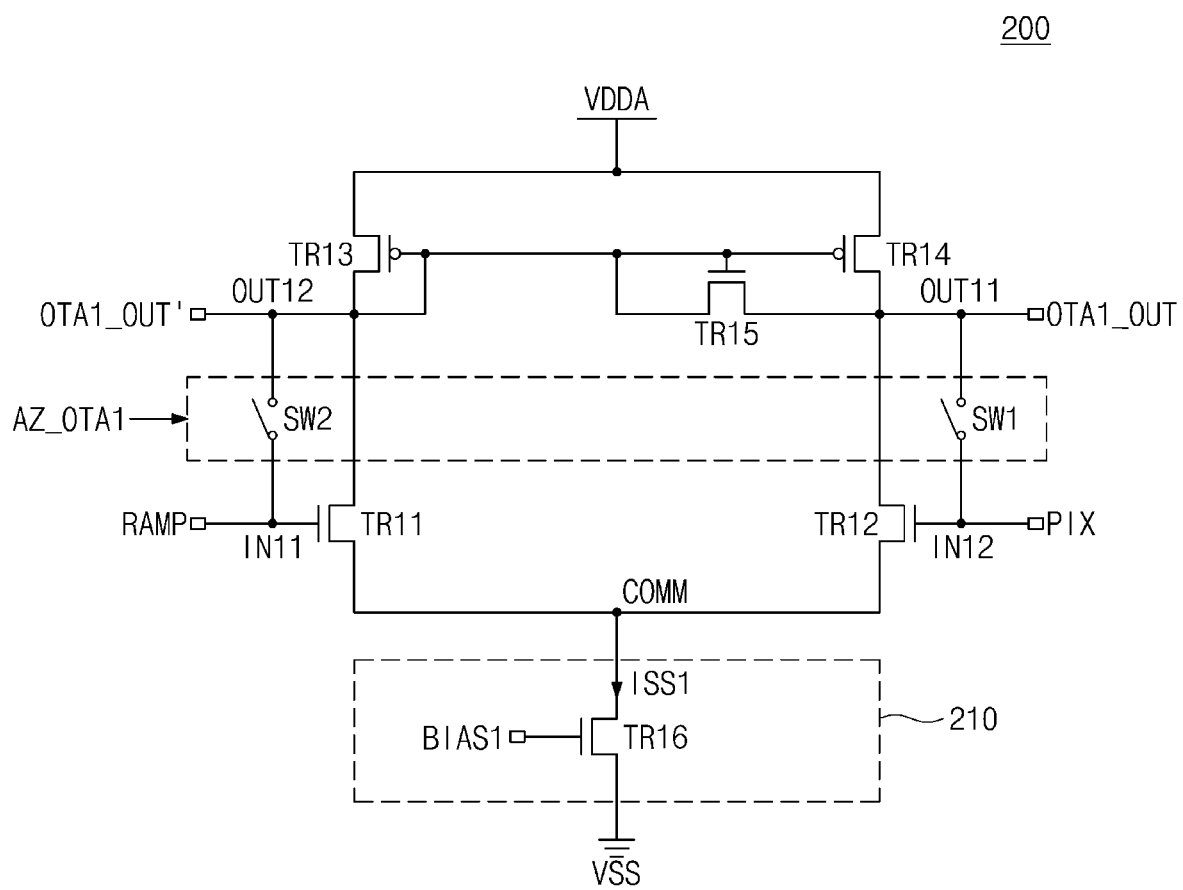
FIG. 5 is a circuit diagram illustrating an example of a first amplifier of FIG. 4 according to example embodiments.

FIG. 5 is a circuit diagram illustrating an example of the first amplifier 151_1 of FIG. 4 according to example embodiments. A first amplifier 200 may include a plurality of transistors TR11 to TR16, a plurality of switches SW1 and SW2, and a first current source 210. For example, the first transistor TR11, the second transistor TR12, the fifth transistor TR15, and the sixth transistor TR16 may be NMOS transistors, and the third transistor TR13 and the fourth transistor TR14 may be PMOS transistors. However, the present disclosure is not limited thereto. The first to sixth transistors TR11 to TR16 may be implemented with transistors whose types are different from those illustrated in FIG. 5.

Referring to FIG. 5, the ramp signal RAMP may be input to a gate terminal of the first transistor TR11, and the pixel signal PIX may be input to a gate terminal of the second transistor TR12. Source terminals of the first and second transistors TR11 and TR12 may be connected to the first current source 210 at a common node COMM. For example, the third and fourth transistors TR13 and TR14 may be connected in the form of a current mirror. A sum of currents flowing to (or through) the first and second transistors TR11 and TR12 may be equal to a first power current ISS1.

A gate terminal and a drain terminal of the third transistor TR13 and a drain terminal of the first transistor TR11 may be connected in common to a second output node OUT12, and a drain terminal of the fourth transistor TR14 and a drain terminal of the second transistor TR12 may be connected in common to a first output node OUT11. The fifth transistor TR15 may be connected between the first and second output nodes OUT11 and OUT12. For example, the fifth transistor TR15 may limit a voltage level of a signal that is output from the first output node OUT11.

The first output signal OTA1_OUT may be output from the first output node OUT11, and an inverted first output signal OTA1_OUT' may be output from the second output node OUT12. For example, in a period where a level of the ramp signal RAMP is higher than a level of the pixel signal PIX, the first output signal OTA1_OUT may have the high level, and in a period where the level of the ramp signal RAMP is lower than the level of the pixel signal PIX, the first output signal OTA1_OUT may have the low level. The first output signal OTA1_OUT may be provided to the second amplifier 151_2 of FIG. 4.

The first current source 210 may include the sixth transistor TR16. The sixth transistor TR16 may be connected to a ground voltage VSS and may generate the first power current ISS1 based on a first bias signal BIAS1.

Meanwhile, during the first auto-zero period, the switches SW1 and SW2 may be turned on in response to the first auto-zero signal AZ_OTA1. When the switches SW1 and SW2 are turned on, a second input node IN12 and the first output node OUT11 may be connected to each other, and a first input node IN11 and the second output node OUT12 may be connected to each other. Accordingly, during the first auto-zero period, levels of the first input node IN11, the second input node IN12, the first output node OUT11, and the second output node OUT12 may be equalized. Although not shown in FIG. 5, a first capacitor connected to the first input node IN11 may receive the ramp signal RAMP, and the second capacitor connected to the second input node IN12 may receive the pixel signal PIX. For example, the first and second capacitors may function as auto-zero level sampling capacitors.

Figure 6:
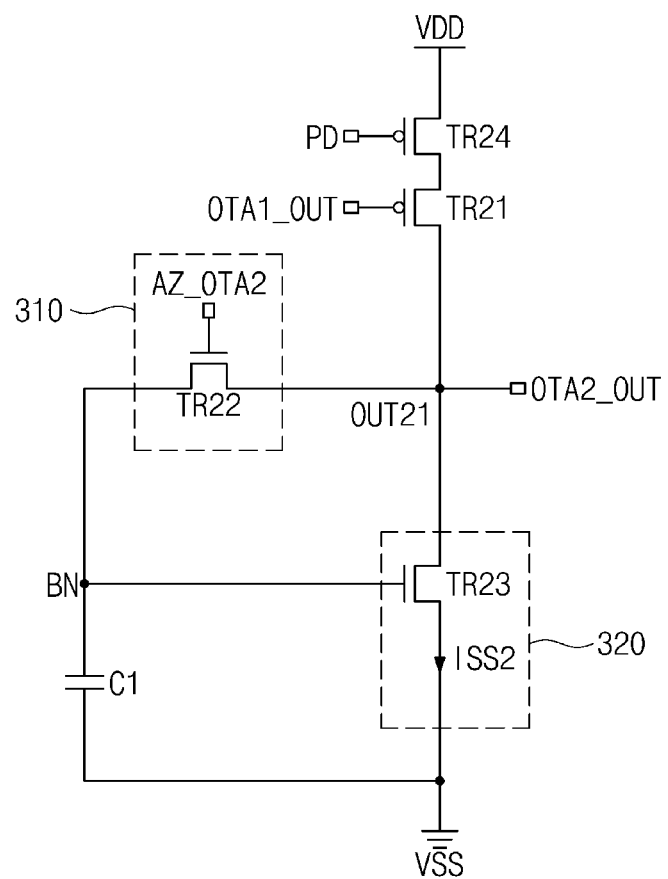
FIG. 6 is a circuit diagram illustrating an example of a second amplifier of FIG. 4 according to example embodiments.

FIG. 6 is a circuit diagram illustrating an example of the second amplifier 151_2 of FIG. 4 according to example embodiments. A second amplifier 300 may include a plurality of transistors TR21 to TR24, a capacitor C1, a switching circuit 310, and a current source 320. For example, the seventh and tenth transistors TR21 and TR24 may be PMOS transistors, and the eighth and ninth transistors TR22 and TR23 may be NMOS transistors. However, the present disclosure is not limited thereto. The seventh to tenth transistors TR21 to TR24 may be implemented with transistors whose types are different from those illustrated in FIG. 6.

The seventh transistor TR21 may receive the first output signal OTA1_OUT from the first amplifier 151_1 of FIG. 4 as an input, and may operate in response to the first output signal OTA1_OUT. For example, when a voltage level of the first output signal OTA1_OUT is the high level, the seventh transistor TR21 may be turned off. In this case, because a current does not flow to a third output node OUT21, a voltage level of the second output signal OTA2_OUT may be the low level. In contrast, when the voltage level of the first output signal OTA1_OUT is the low level, the seventh transistor TR21 may be turned on. In this case, because a current flows to the third output node OUT21, the voltage level of the second output signal OTA2_OUT may be the high level. In other words, the second amplifier 300 may operate as an inversion amplifier. For example, when the voltage level of the first output signal OTA1_OUT increases, the voltage level of the second output signal OTA2_OUT may decrease.

The switching circuit 310 may include the eighth transistor TR22 connected between the third output node OUT21 and a bias node BN. During the second auto-zero period, the eighth transistor TR22 may operate in response to the second auto-zero signal AZ_OTA2, and may be turned on when the second auto-zero signal AZ_OTA2 is activated. When the eighth transistor TR22 is turned on, the voltage level of the bias node BN and the voltage level of the third output node OUT21 may be equalized, and charges may be charged in the capacitor C1 connected to the bias node BN.

When charges are fully charged in the capacitor C1, the initialization of the second amplifier 300 may be completed, and the second auto-zero period may end. For example, the length of the second auto-zero period may be optimized based on a time taken to charge the capacitor C1 connected to the bias node BN with charges. As described with reference to FIG. 4, the optimized length of the second auto-zero period may be shorter than the length of the first auto-zero period.

In contrast, in the case where the eighth transistor TR22 is turned off as the second auto-zero signal AZ_OTA2 is deactivated during the comparison operation of the ADC circuit 150 of FIG. 4, the voltage level of the bias node BN, which is equal to the voltage level of the third output node OUT21, may be maintained by the capacitor C1, and thus, the current source 320 may operate.

The current source 320 may include the ninth transistor TR23 connected to the third output node OUT21. The ninth transistor TR23 may generate a power current ISS2 based on the voltage of the bias node BN, that is, the voltage of one end of the capacitor C1.

As described above, when charges are fully charged in the capacitor C1 connected to the bias node BN, the second auto-zero signal AZ_OTA2 may be deactivated, and the second auto-zero period may end. In this case, the tenth transistor TR24 may be turned off in response to a power down signal PD activated, and thus, the operation of the second amplifier 300 may be temporarily stopped (i.e., may be temporarily powered down). That is, the tenth transistor TR24 may operate as a power down switch of the second amplifier 300.

The operation of the second amplifier 300 may be stopped until the first amplifier 200 of FIG. 10 performs the comparison operation. In other words, when the first auto-zero period of the first amplifier 200 ends (i.e., when the first auto-zero signal AZ_OTA1 is deactivated), the power down signal PD may be deactivated, and the tenth transistor TR24 may be turned on. As such, the second amplifier 300 may again start to operate.

In other words, the tenth transistor TR24 may be turned on in response to the power down signal PD of the low level during the second auto-zero period and during the comparison operation period and may be turned off in response to the power down signal PD of the high level between the second auto-zero period and the comparison operation period. Through the above operation of the tenth transistor TR24, the power consumption of the second amplifier 300 may be reduced between the second auto-zero period and the comparison operation period.

Figure 7:
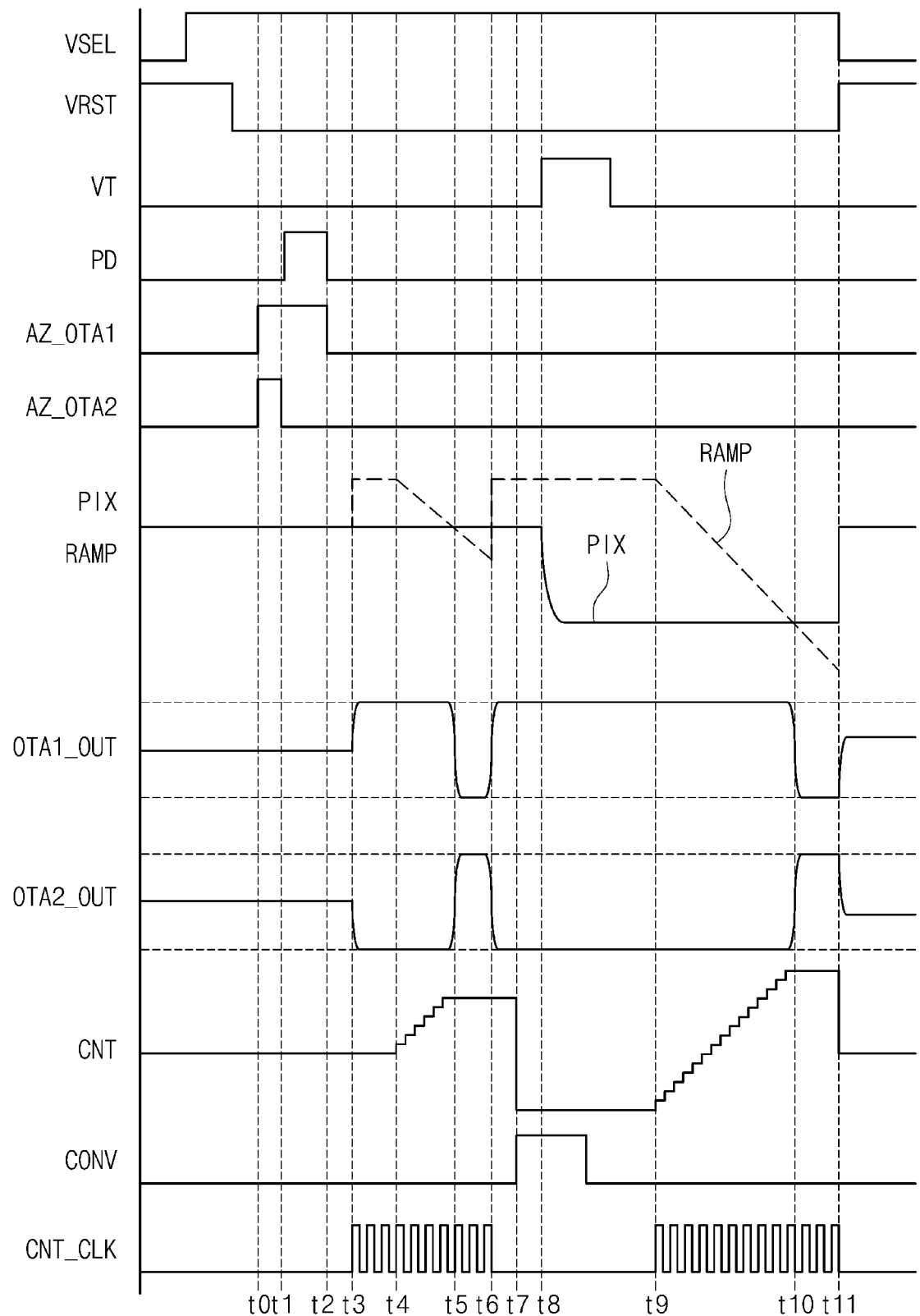
FIG. 7 is a timing diagram illustrating an operation of an analog-to-digital converting circuit of FIG. 4 according to example embodiments.

FIG. 7 is a timing diagram illustrating an operation of the analog-to-digital converting (ADC) circuit 150 of FIG. 4 according to example embodiments. Referring to FIG. 7, a period from a first time point t0 to a third time point t2 may be defined as the auto-zero period (including the first auto-zero period and the second auto-zero period), a period from the third time point t2 to a twelfth time point t11 may be defined as the comparison operation period, a period from a fourth time point t3 or a fifth time point t4 to a seventh time point t6 may be defined as a first operation period, and a period from the seventh time point t6 or a tenth time point t9 to a eleventh time point t10 may be defined as a second operation period. In detail, a period from the first time point t0 to the third time point t2 may be defined as the first auto-zero period, and a period from the first time point t0 to a second time point t1 may be defined as the second auto-zero period. In addition, a period from the second time point t1 to the third time point t2 may be defined as the power down period.

The selection signal VSEL may be activated before the first time point to, and the pixel signals PIX may be output from a plurality of pixel groups (e.g., pixel groups illustrated in FIG. 3) of a pixel array of FIG. 2. Also, a power supply voltage may be provided by the reset signal VRST activated before the first time point to. In an embodiment, levels of the pixel signal PIX and the ramp signal RAMP may be determined by circuits (not shown) before the first time point t0 and after the twelfth time point t11. Below, FIG. 7 will be described with reference to FIGS. 4 to 6 together.

The first auto-zero signal AZ_OTA1 may be activated from the first time point t0 to the third time point t2. The second auto-zero signal AZ_OTA2 may be activated from the first time point t0 to the second time point t1, and deactivated from the second time point t1 to the third time point t2. The first amplifier 151_1 may be initialized in response to the first auto-zero signal AZ_OTA1 during the first auto-zero period (i.e., from the first time point t0 to the third time point t2), and the second amplifier 151_2 may be initialized in response to the second auto-zero signal AZ_OTA2 during the second auto-zero period (i.e., from the first time point t0 to the second time point t1).

As described with reference to FIG. 6, the length of the second auto-zero period may be determined based on a time taken to fully charge a capacitor (e.g., C1 of FIG. 6) included in the second amplifier 151_2 with charges. When the second amplifier 151_2 is completely initialized, the second auto-zero signal AZ_OTA2 may be deactivated, and the second auto-zero period may end.

In this case, the power down signal PD may be activated. As such, the power down switch (e.g., TR24 of FIG. 6) of the second amplifier 151_2 may be turned off, and the operation of the second amplifier 151_2 may be temporarily stopped from the second time point t1 to the third time point t2. According to the above description, the power consumption of the second amplifier 151_2 may reduce from the second time point t1 to the third time point t2, and the power consumption of the ADC circuit 150 may also overall reduce. The power down signal PD may again be deactivated when the first auto-zero period ends and the comparison operation period starts.

To perform digital conversion on a reset signal of the pixel signal PIX, an offset may be applied to the ramp signal RAMP at the fourth time point t3, and the ramp signal RAMP may decrease from the fifth time point t4. The counter 152 may count the counting clock signal CNT_CLK from the fifth time point t4 to a sixth time point t5 at which a polarity of the second output signal OTA2_OUT being an output of the second amplifier 151_2 changes.

In the case where the digital conversion for the reset signal ends, to convert an image signal of the pixel signal PIX into a digital signal at the seventh time point t6, an offset may again be applied to the ramp signal RAMP at the seventh time point t6, and bits of the counter 152 may be inverted in response to the inversion signal CONV at an eighth time point t7. The transfer signal VT may be activated at a ninth time point t8, and during the activation of the transfer signal VT, a voltage level of an input node of the first amplifier 151_1, through which the pixel signal PIX corresponding to charges integrated by the photoelectric conversion element PD is received, may change.

To perform digital conversion on the image signal, a level of the ramp signal RAMP may decrease at the tenth time point t9. The counter 152 may count the counting clock signal CNT_CLK from the tenth time point t9 to the eleventh time point t10 at which a polarity of the second output signal OTA2_OUT being an output of the second amplifier 151_2 changes. For example, the counter 152 of FIG. 4 may output the digital signal DS at the eleventh time point t10. In the case where the digital conversion for the image signal ends, the ADC circuit 150 may be initialized for a next comparison operation (i.e., for correlated double sampling).

The operation timing of the ADC circuit 150 is described with reference to FIG. 7, but the present disclosure is not limited thereto. For example, timings of signals may be changed or modified depending on the way to implement the ADC circuit 150 (e.g., structures of the first amplifier 151_1 and the second amplifier 151_2).

Figure 8:
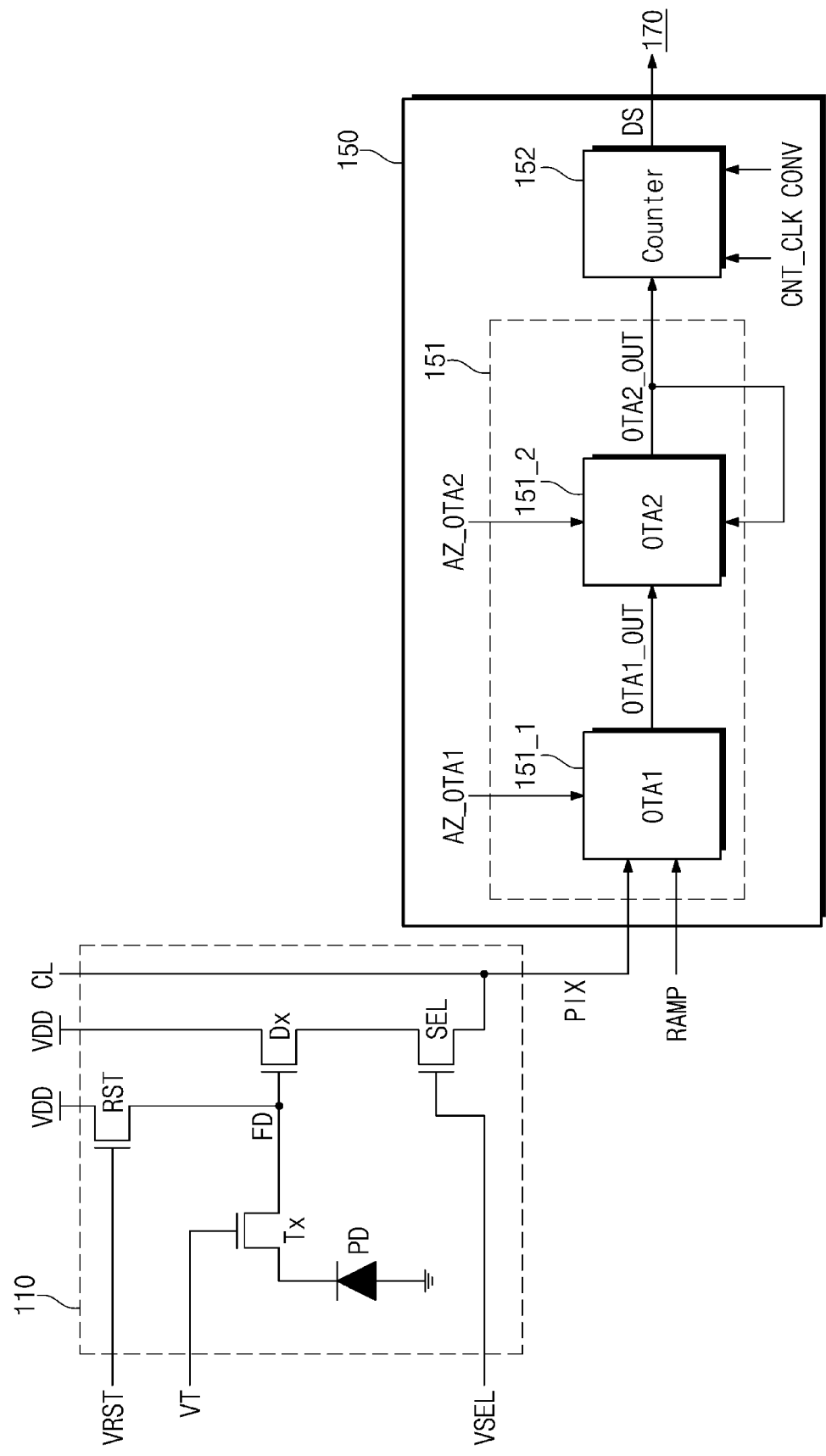
FIG. 8 illustrates another example of a configuration of an analog-to-digital converting circuit of FIG. 2 according to example embodiments.

FIG. 8 illustrates another example of a configuration of the analog-to-digital converting (ADC) circuit 150 of FIG. 2 according to example embodiments. Referring to FIG. 8, the second output signal OTA2_OUT may be fed back to the second amplifier 151_2. The second output signal OTA2_OUT fed back to the second amplifier 151_2 may control a power source (e.g., a current source) of the second amplifier 151_2 and may reduce power consumption of the ADC circuit 150. The output feedback operation of the second amplifier 151_2 described above may be performed both when the reset signal of the pixel signal PIX and the ramp signal RAMP are compared and when the image signal of the pixel signal PIX and the ramp signal RAMP are compared.

For example, as the ADC circuit 150 of FIG. 8 further performs the output feedback operation as well as the auto-zero period optimization, the power consumption of the ADC circuit 150 of FIG. 8 may further reduce compared to the ADC circuit 150 of FIG. 4. A function of the ADC circuit 150 of FIG. 8 is identical to that described with reference to FIG. 4 except for the above output feedback operations, and thus, additional description will be omitted to avoid redundancy.

Figure 9:
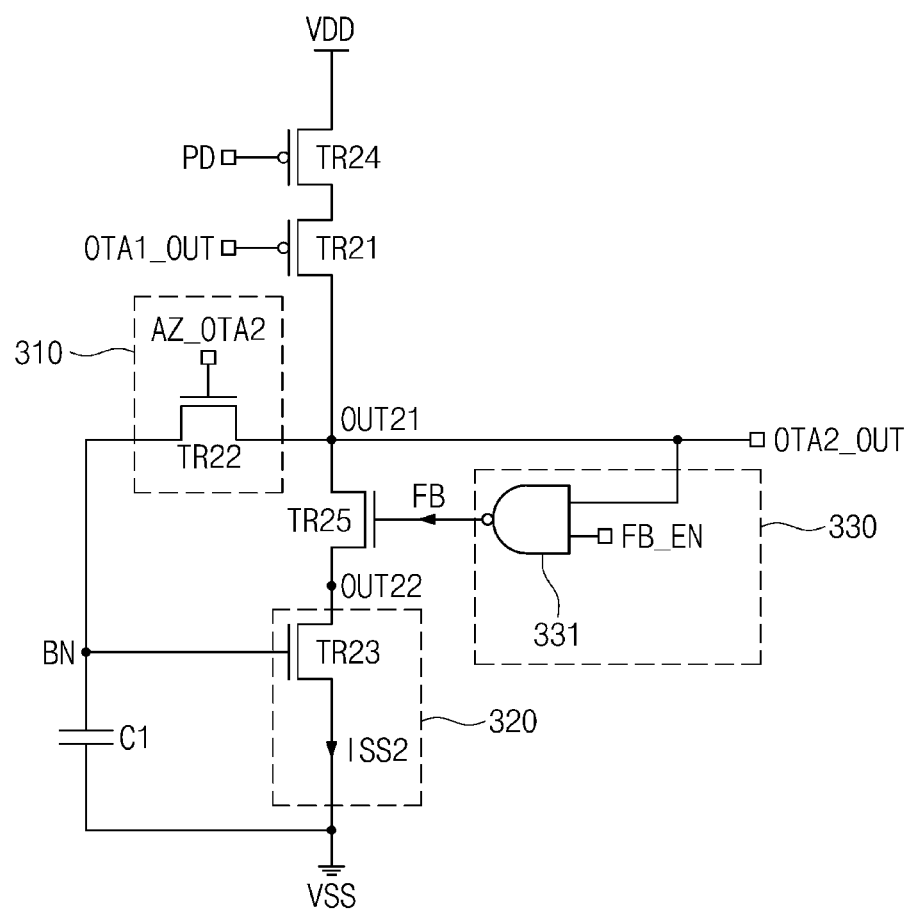
FIG. 9 is a circuit diagram illustrating another example of a second amplifier of FIG. 8 according to example embodiments.

FIG. 9 is a circuit diagram illustrating another example of the second amplifier 151_2 of FIG. 8 according to example embodiments. A second amplifier 300a may further include an eleventh transistor TR25 and a feedback circuit 330. For example, the eleventh transistor TR25 may be an NMOS transistor. However, the present disclosure is not limited thereto. For example, the eleventh transistor TR25 may be a transistor whose kind is different from that illustrated in FIG. 9. Referring to FIG. 9, when the seventh transistor TR21 is turned on, a current may also flow to the eleventh transistor TR25. The second output signal OTA2_OUT may be provided to the feedback circuit 330.

The feedback circuit 330 may control the current source 320 based on the second output signal OTA2_OUT and a feedback enable signal FB_EN. To perform the output feedback operation, the feedback circuit 330 may include a logic gate 331. For example, the logic gate 331 may be a NAND gate.

The logic gate 331 may output a feedback signal FB in response to the second output signal OTA2_OUT and the feedback enable signal FB_EN. For example, the logic gate 331 may be implemented such that a voltage level of the feedback signal FB is set to the low level when both a voltage level of the feedback enable signal FB_EN and a voltage level of the second output signal OTA2_OUT are the high level.

When the voltage level of the feedback signal FB is the high level, the eleventh transistor TR25 may be turned on, and the power current ISS2 may flow through the eleventh transistor TR25. However, when the voltage level of the feedback signal FB is the low level, the eleventh transistor TR25 may be turned off, and the power current ISS2 may not flow through the eleventh transistor TR25.

In detail, after the comparison operation of the ramp signal RAMP and the pixel signal PIX ends, the voltage level of the first output signal OTA1_OUT may be the low level, and the voltage level of the second output signal OTA2_OUT may be the high level. In this case, before the feedback enable signal FB_EN is activated, the feedback signal FB may be at the high level, the eleventh transistor TR25 may be in a turn-on state, and the power current ISS2 may flow through the eleventh transistor TR25.

In contrast, when the feedback enable signal FB_EN is activated (i.e., when the voltage level of the feedback enable signal FB_EN is the high level), the voltage level of the feedback signal FB may transition to the low level. In this case, because the eleventh transistor TR25 is turned off, the power current ISS2 may not flow through the eleventh transistor TR25. As such, by utilizing an output feedback after the comparison operation ends, power consumption of the second amplifier 300 may reduce. This may mean that power consumption of the ADC circuit 150 also reduces.

As a power consumption difference before and after the comparison operation is performed is maintained, the performance of an image sensor (e.g., the performance of an ADC circuit converting a pixel signal into a digital signal) may degrade. According to the above operation of the feedback circuit 330, the power current ISS2 may not flow through the output nodes OUT21 and OUT22 after the comparison operation is performed, and thus, a power consumption difference before and after the comparison operation is performed may decrease. Accordingly, the degradation of performance of the image sensor may be improved by the operation of the feedback circuit 330.

Meanwhile, the logic gate 331 of FIG. 9 is illustrated as being a NAND gate, but the present disclosure is not limited thereto. For example, the feedback circuit 330 may be implemented as any other component(s) (e.g., a NOR gate and an inversion amplifier) such that the feedback signal FB is set to the low level when the voltage level of the second output signal OTA2_OUT is the high level.

Also, the feedback circuit 330 of FIG. 9 is illustrated as directly receiving the second output signal OTA2_OUT, but the present disclosure is not limited thereto. For example, the feedback circuit 330 of FIG. 9 may receive any other signal that is based on the second output signal OTA2_OUT. For example, the second amplifier 300a may further include a transistor, a switch, an inverter, or a logic gate connected between the seventh transistor TR21 and the third output node OUT21. In this case, the logic gate 331 of the feedback circuit 330 may receive a signal that is obtained after the second output signal OTA2_OUT passes through the transistor, the switch, the inverter, or the logic gate connected between the seventh transistor TR21 and the third output node OUT21, and may perform the comparison operation described above.

In other words, the feedback circuit 330 may directly receive the second output signal OTA2_OUT, or may receive a signal that is obtained after the second output signal OTA2_OUT passes through the transistor, the switch, the inverter, or the logic gate connected between the seventh transistor TR21 and the third output terminal OUT21.

As a result, compared to the second amplifier 300 of FIG. 6, the second amplifier 300a of FIG. 9 may further reduce the power consumption by using both the operation of the tenth transistor TR24 according to the optimization of the second auto-zero period and the operation of the feedback circuit 330. The configuration and the operation of the second amplifier 300a illustrated in FIG. 9 are identical to those of the second amplifier 300 of FIG. 6 except for the operation of the feedback circuit 330 described above, and thus, additional description will be omitted to avoid redundancy.

Figure 10A:
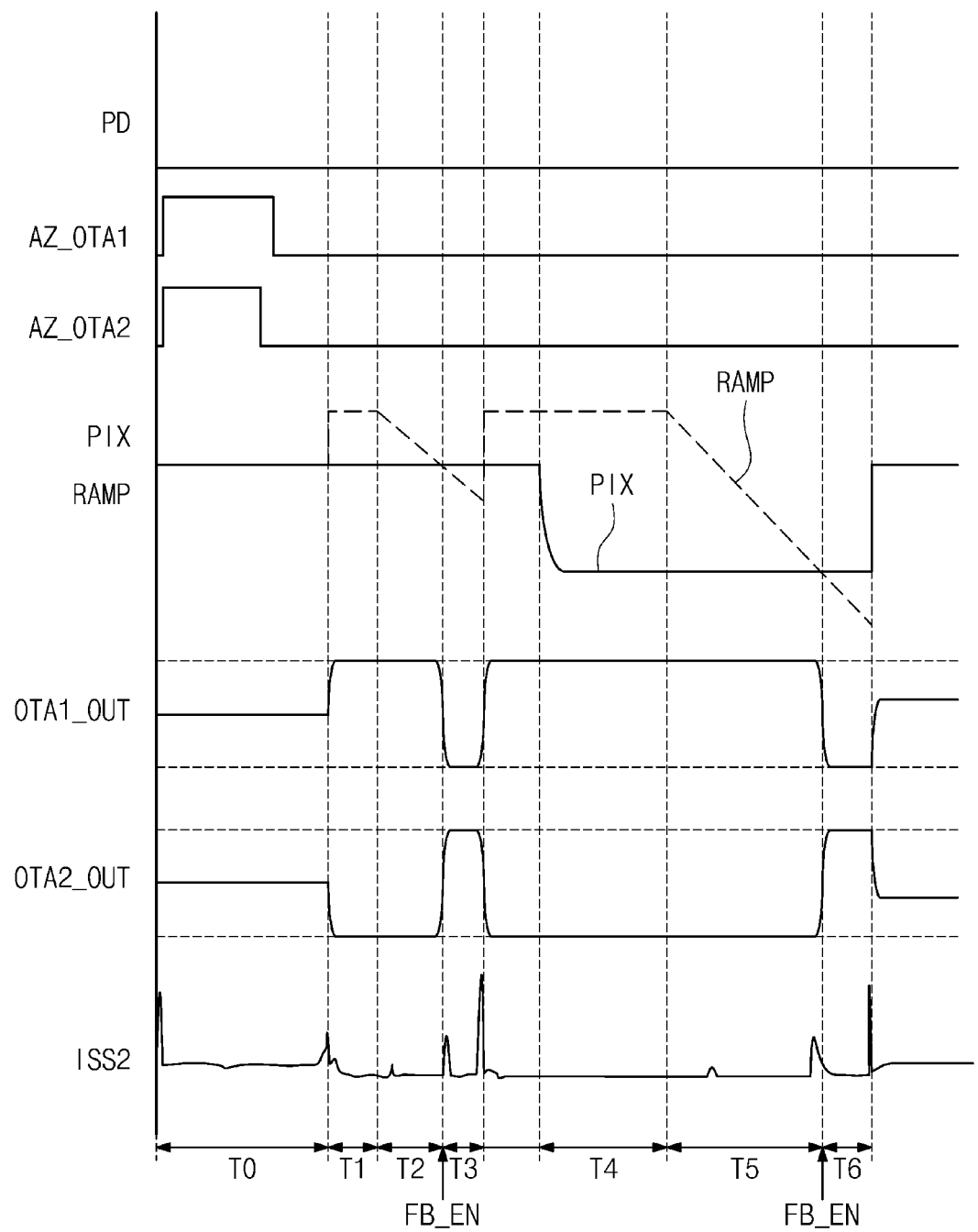
FIG. 10A is a timing diagram illustrating an example of an operation of an analog-to-digital converting circuit of FIG. 4 according to an operation of a feedback circuit of FIG. 9, according to example embodiments.
Figure 10B:
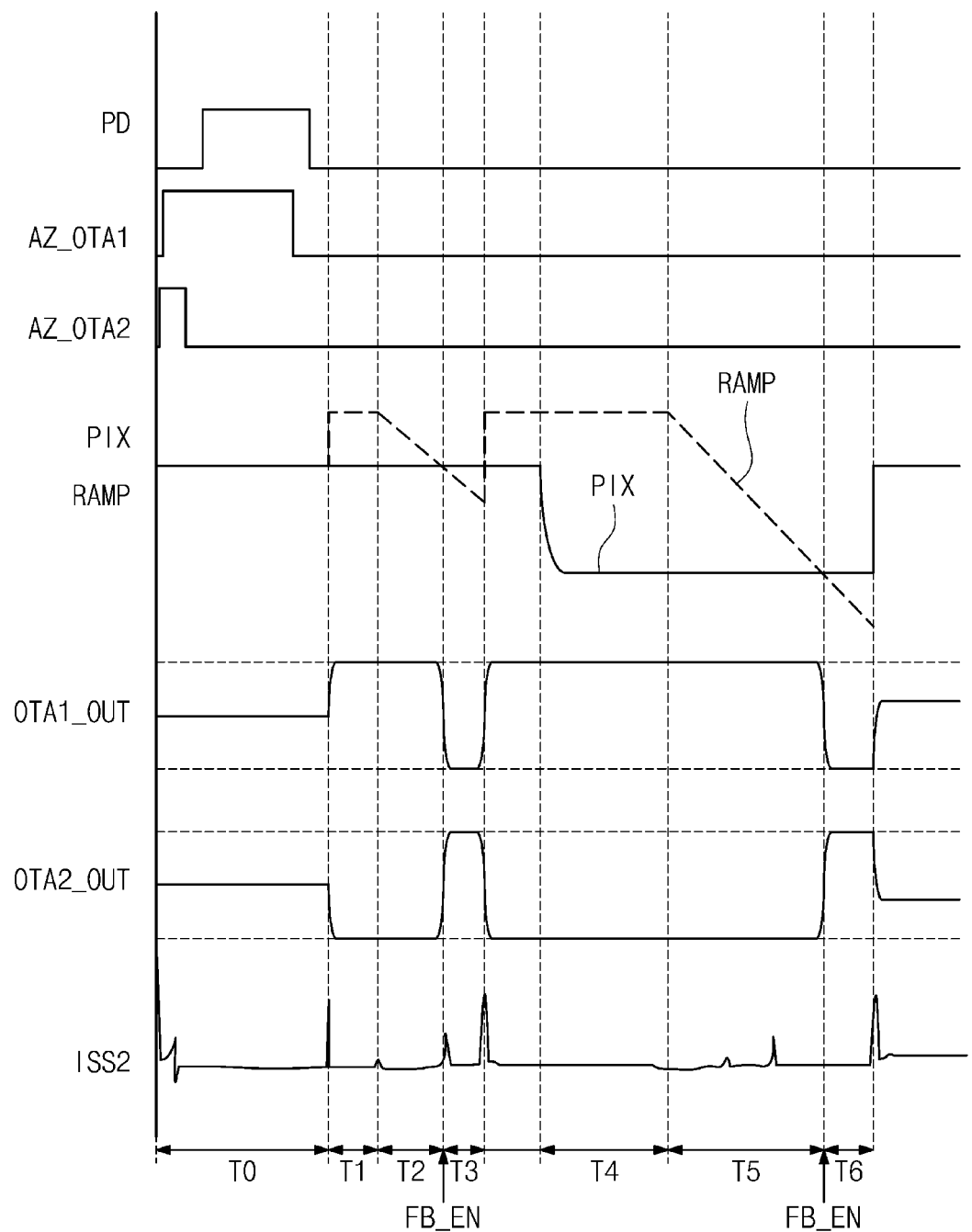
FIG. 10B is a timing diagram illustrating an example of an operation of an analog-to-digital converting circuit of FIG. 4 according to auto-zero period optimization and an operation of a feedback circuit of FIG. 9, according to example embodiments.

FIG. 10A is a timing diagram illustrating an example of an operation of the ADC circuit 150 of FIG. 4 according to an operation of the feedback circuit 330 of FIG. 9, according to example embodiments, and FIG. 10B is a timing diagram illustrating an example of an operation of the ADC circuit 150 of FIG. 4 according to an operation of auto-zero period optimization and an operation of the feedback circuit 330 of FIG. 9, according to example embodiments. That is, FIG. 10A corresponds to the case where the second amplifier 300a of FIG. 9 uses only the output feedback operation, and FIG. 10B corresponds to the case where the second amplifier 300a of FIG. 9 uses both the auto-zero period optimization and the output feedback operation. Also, in FIG. 10A, it is assumed that the length of the second auto-zero period is not optimized and is similar to the length of the first auto-zero period, and it is assumed that the power down signal PD is not activated.

Referring to FIGS. 10A and 10B, a first time period T0 may correspond to the auto-zero period, a second time period T1 to a fourth time period T3 may correspond to a period where the comparator 151 of FIG. 4 compares a reset signal of the pixel signal PIX and the ramp signal RAMP, and a fifth time period T4 to a seventh time period T6 may correspond to a period where the comparator 151 compares an image signal of the pixel signal PIX and the ramp signal RAMP. The feedback enable signal FB_EN may be activated when the decision of the ADC circuit 150 is completed (i.e., when a third time period T2 ends and when a sixth time period T5 ends). For example, a voltage level of the feedback enable signal FB_EN may be maintained at the high level during the fourth time period T3 in which the ramp signal RAMP ramps down and the second output signal OTA2_OUT changes and/or during time the seventh period T6 in which the ramp signal RAMP ramps down and the second output signal OTA2_OUT changes.

The feedback circuit 330 may output the feedback signal FB based on the feedback enable signal FB_EN and the second output signal OTA2_OUT. A transistor (e.g., the eleventh transistor TR25) between the current source 320 and the output node OUT21 may be turned off in response to the feedback signal FB of the low level, and the power current ISS2 may not flow.

Accordingly, the operation of the feedback circuit 330 may allow the power current ISS2 to have almost the same level over the second time period T1 to the fourth time period T3 and the fifth time period T4 to the seventh time period T6. For example, the level of the power current ISS2 may be close to "0" over the second time period T1 to the fourth time period T3 and the fifth time period T4 to the seventh time period T6. As such, power consumption of the ADC circuit 150 may reduce.

Meanwhile, referring to FIG. 10B, the first time period T0 being the auto-zero period may be subdivided into a first auto-zero period where the first auto-zero signal AZ_OTA1 is activated, and a second auto-zero period where the second auto-zero signal AZ_OTA2 is activated. As described with reference to FIGS. 4 and 6, the second auto-zero period may end after charges are fully charged in a capacitor (e.g., the capacitor C1 of FIG. 6) included in the second amplifier 151_2.

When the second auto-zero period ends, the power down signal PD may be activated, and thus, the operation of the second amplifier 151_2 may be temporarily stopped until the comparison operation period starts. Accordingly, while the power down signal PD is activated, the power current ISS2 may not flow, and thus, power consumption of the ADC circuit 150 may reduce. As a result, referring to FIG. 10B, through the auto-zero period optimization, the level of the power current ISS2 may be close to "0" until the comparison operation period starts after the second amplifier 151_2 is initialized, and thus, power consumption of the ADC circuit 150 may further reduce compared to FIG. 10A.

Figure 11:
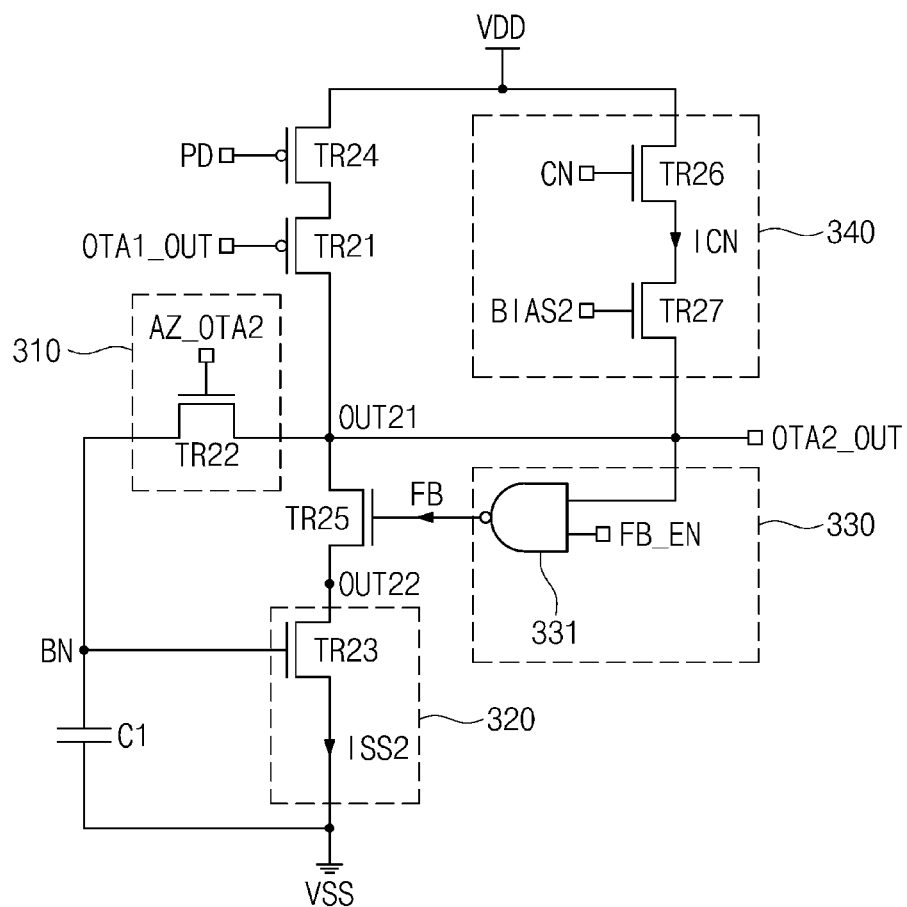
FIG. 11 is a circuit diagram illustrating another example of a second amplifier of FIG. 8 according to example embodiments.

FIG. 11 is a circuit diagram illustrating another example of the second amplifier 151_2 of FIG. 8 according to example embodiments. A second amplifier 300b may further include a control circuit 340. The control circuit 340 may adjust an output of a control current ICN to alleviate a power consumption difference of the second amplifier 300b before and after the comparison operation is performed. The control circuit 340 may include twelfth and thirteenth transistors TR26 and TR27 that are connected between the power supply voltage VDD and the third output node OUT21 and are connected in parallel with the seventh transistor TR21 and the tenth transistor TR24.

The twelfth transistor TR26 may operate in response to a control signal CN, and the thirteenth transistor TR27 may operate in response to a second bias signal BIAS2. Herein, the control signal CN may be generated from the timing controller 160 of FIG. 2. In an embodiment, a gate of the thirteenth transistor TR27 may connect to the bias node BN. For example, the twelfth and thirteenth transistors TR26 and TR27 may be NMOS transistors. However, the present disclosure is not limited thereto. The twelfth and thirteenth transistors TR26 and TR27 may be implemented with transistors whose types are different from those illustrated in FIG. 11.

When the control signal CN is deactivated, the twelfth transistor TR26 may be turned off, and the control current ICN may not flow through the thirteenth transistor TR27. Meanwhile, when the twelfth transistor TR26 is turned on by the activated control signal CN and the thirteenth transistor TR27 is turned on by the second bias signal BIAS2, the control current ICN may flow to the output nodes OUT21 and OUT22 through the twelfth transistor TR26 and the thirteenth transistor TR27.

After the decision about a large-small relationship between the level of the ramp signal RAMP and the level of the pixel signal PIX is completed, the level of the power current ISS2 may increase, and a power may be continuously consumed even after the comparison operation is performed. As described above, as a power consumption difference before and after the comparison operation is performed is continuous, the performance of an image sensor may degrade.

The control circuit 340 may operate to prevent the degradation of performance of the image sensor. After the ramp signal RAMP starts to ramp down, as the control signal CN and the second bias signal BIAS2 are activated, as described above, the control current ICN may flow to the output nodes OUT21 and OUT22 through the twelfth and thirteenth transistors TR26 and TR27, and the level of the power current ISS2 may be increased as much as the level of the control current ICN.

For example, the level (hereinafter referred to as a "second level") of the power current ISS2 increased as much as the level of the control current ICN after the ramp signal RAMP starts to ramp down may be higher than the level (hereinafter referred to as a "first level") of the power current ISS2 before the comparison operation is performed, and may be lower than the level (hereinafter referred to as a "third level") of the power current ISS2 after the comparison operation is performed (i.e., after the decision about the large-small relationship between the voltage level of the ramp signal RAMP and the voltage level of the pixel signal PIX is completed).

According to the above operation of the control circuit 340, both a difference between the first level and the second level and a difference between the second level and the third level may be smaller than a difference between the first level and the third level. As such, a power consumption difference before and after the comparison operation of the second amplifier 300b may be alleviated, and the degradation of performance of the image sensor may be improved. Accordingly, the degradation of performance of the image sensor due to the power consumption difference before and after the comparison operation may be improved by the operation of the feedback circuit 330 and the operation of the control circuit 340, which is described above.

As a result, compared to the second amplifier 300 of FIG. 6, the second amplifier 300b of FIG. 11 may further reduce the power consumption by using both of the operation of the feedback circuit 330 and the operation of the control circuit 340, as well as the operation of the tenth transistor TR24 according to the optimization of the second auto-zero period. The configuration and the operation of the second amplifier 300b illustrated in FIG. 11 are identical to those of the second amplifier 300 of FIG. 6 and the second amplifier 300a of FIG. 9 except for the operation of the control circuit 340 described above, and thus, additional description will be omitted to avoid redundancy.

Figure 12:
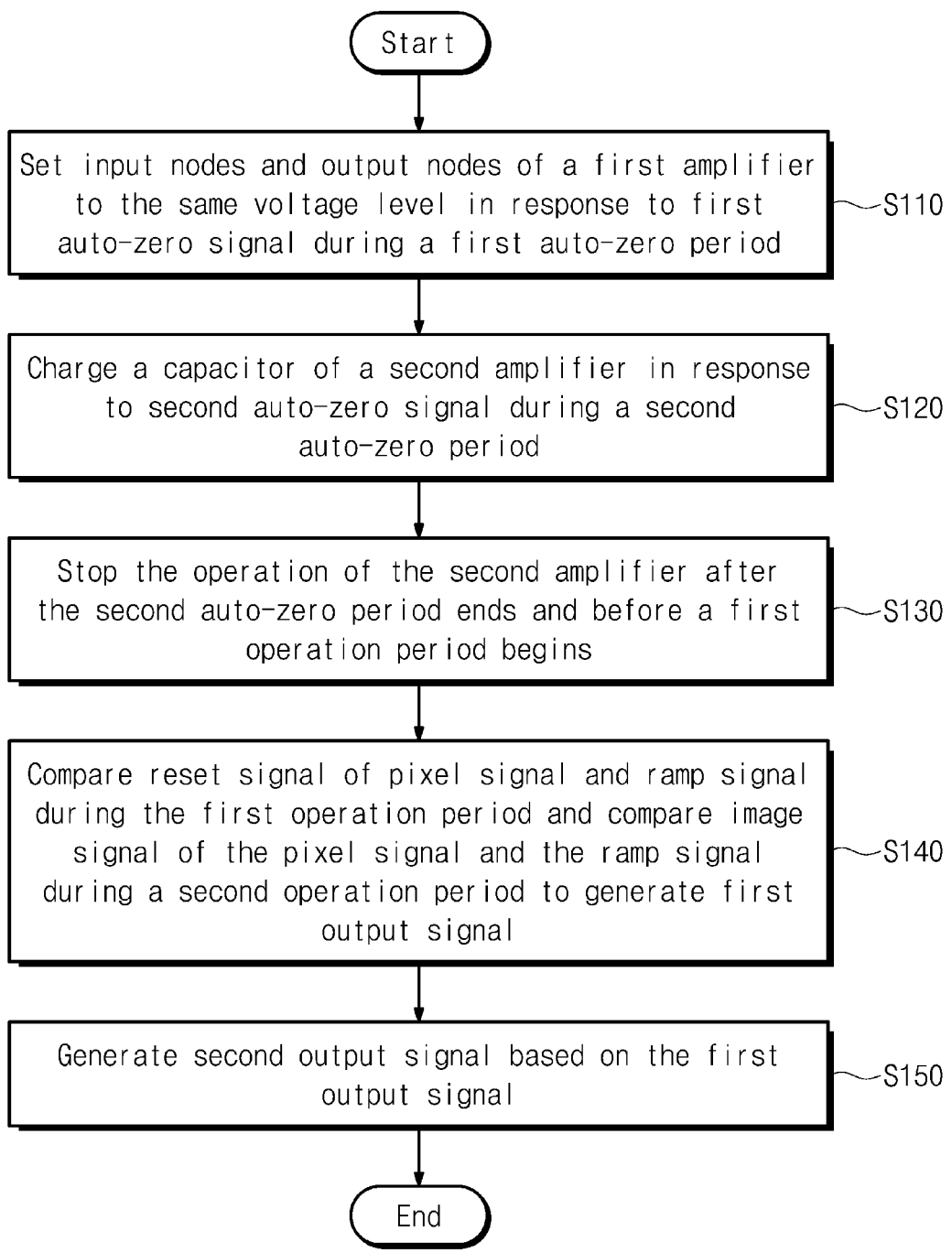
FIG. 12 is a flowchart illustrating an operation method of an analog-to-digital converting circuit using auto-zero period optimization according to example embodiments of the present disclosure.

FIG. 12 is a flowchart illustrating an operation method of an analog-to-digital converting (ADC) circuit using auto-zero period optimization according to example embodiments of the present disclosure. FIG. 12 will be described with reference to FIGS. 2 and 4 to 6 together.

In operation S110, the first amplifier 151_1 may set voltage levels of input nodes and output nodes to the same voltage level in response to the first auto-zero signal AZ_OTA1. In operation S120, the second amplifier 151_2 may charge charges in a capacitor in response to the second auto-zero signal AZ_OTA2. In operation S130, the operation of the second amplifier 151_2 may be temporarily stopped until the comparison operation period starts after the second auto-zero period ends.

In operation S140, the first amplifier 151_1 may compare the pixel signal PIX output from the pixel array 110 with the ramp signal RAMP during the comparison operation period and may generate the first output signal OTA1_OUT. In detail, the first amplifier 151_1 may compare the reset signal of the pixel signal PIX and the ramp signal RAMP during a first operation period, may compare the image signal of the pixel signal PIX and the ramp signal RAMP during a second operation period, and may perform correlated double sampling (CDS) on comparison results.

In operation S150, the second amplifier 151_2 may generate the second output signal OTA2_OUT based on the first output signal OTA1_OUT. For example, the second output signal OTA2_OUT may be an inverted version of the first output signal OTA1_OUT.

According to an embodiment of the present disclosure, power consumption of an analog-to-digital converting circuit may decrease by optimizing an auto-zero period.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A circuit comprising:
a first amplifier configured to:
equalize voltage levels of input nodes and an output node of the first amplifier in response to a first auto-zero signal in a first auto-zero period,
receive a ramp signal at a first input node of the input nodes, and a pixel signal output from a pixel array at a second input node of the input nodes through a column line of the pixel array, the column line connected to the second input node of the first amplifier,
first compare the ramp signal and a reset signal of the pixel signal in a first operation period,
second compare the ramp signal and an image signal of the pixel signal in a second operation period after the first operation period, and
generate a first output signal on the output node in the first and second operation periods based on the first and second comparison results; and
a second amplifier including an input node connected to the output node of the first amplifier, and the second amplifier configured to:
charge a capacitor in response to a second auto-zero signal different from the first auto-zero signal in a second auto-zero period,
stop operation of the second amplifier from a time point at which the second auto-zero period ends to a time point at which the first operation period starts,
receive the first output signal from the first amplifier at the input node of the second amplifier, and
generate a second output signal based on the first output signal from the first amplifier in the first operation period and the second operation period,
wherein the second auto-zero period overlaps the first auto-zero period, and
wherein, when the operation of the second amplifier is stopped, the circuit is configured such that the second amplifier is blocked from providing a power supply voltage from the time point at which the second auto-zero period ends to the time point at which the first operation period starts.

2. The circuit of claim 1, wherein a length of the second auto-zero period is determined based on a time taken for the capacitor to be fully charged and is shorter than a length of the first auto-zero period.

3. The circuit of claim 1, wherein the second amplifier includes:
a first transistor configured to provide the power supply voltage to a first output node, from which the second output signal is output, in response to the first output signal;
a second transistor connected to the capacitor through a bias node, and configured to turn on in response to the second auto-zero signal;
a current source connected to the first transistor through the first output node, connected to the capacitor and the second transistor through the bias node, and configured to generate a power current based on a voltage level of the bias node, which is maintained by the capacitor; and
a third transistor connected to the first transistor, and configured to provide the power supply voltage to the first transistor and turn off in response to a power down signal such that the operation of the second amplifier is stopped.

4. The circuit of claim 3, wherein the third transistor is configured to:
turn off in response to the power down signal being activated when the second auto-zero period ends, and
turn on in response to the power down signal being deactivated when the first operation period starts.

5. The circuit of claim 3, wherein the first transistor and the third transistor are PMOS transistors, and the second transistor is an NMOS transistor.

6. The circuit of claim 3, wherein the second amplifier further includes:
a feedback circuit connected to the first output node, and configured to receive the second output signal, and to output a feedback signal; and
a fourth transistor connected to the current source through a second output node, and configured to electrically connect the first output node to the second output node in response to the feedback signal.

7. The circuit of claim 6, wherein the feedback circuit includes a logic gate configured to output the feedback signal based on the second output signal and a feedback enable signal, and
wherein the fourth transistor is turned off in response to the feedback signal.

8. The circuit of claim 7, wherein the fourth transistor is an NMOS transistor, and the logic gate is a NAND gate.

9. The circuit of claim 6, wherein the second amplifier further includes:
a control circuit configured to output a control current in response to a control signal,
wherein the control circuit includes:
a fifth transistor configured to generate the control current based on the power supply voltage, in response to the control signal; and
a sixth transistor configured to provide the control current to the first output node in response to a bias signal.

10. The circuit of claim 9, wherein, during the first operation period or the second operation period, when the ramp signal starts to ramp down, the control circuit outputs the control current to the current source through the first output node and the second output node.

11. An operation method of an analog-to-digital converting circuit including a first amplifier and a second amplifier, the method comprising:
equalizing voltage levels of input nodes and an output node of the first amplifier in response to a first auto-zero signal in a first auto-zero period;
charging a capacitor of the second amplifier in response to a second auto-zero signal in a second auto-zero period overlapping the first auto-zero period;
stopping operation of the second amplifier from a time point at which the second auto-zero period ends to a time point at which a first operation period starts;
receiving a pixel signal output from a pixel array at an input node of the input nodes of the first amplifier through a column line of the pixel array, the column line connected to the input node of the first amplifier;
generating a first output signal from the output node of the first amplifier by comparing a ramp signal and a reset signal of the pixel signal during the first operation period and comparing the ramp signal and an image signal of the pixel signal during a second operation period after the first operation period;
receiving the first output signal from the first amplifier at an input node of the second amplifier, the input node of the second amplifier connected to the output node of the first amplifier; and
generating a second output signal from an output node of the second amplifier based on the first output signal from the first amplifier in the first and second operation periods,
wherein the stopping of the operation of the second amplifier includes:
blocking a supply of a power supply voltage to the second amplifier from the time point at which the second auto-zero period ends to the time point at which the first operation period starts.

12. The method of claim 11, wherein the charging of the capacitor of the second amplifier includes determining a length of the second auto-zero period based on a time taken for the capacitor to be fully charged,
wherein the length of the second auto-zero period is shorter than a length of the first auto-zero period, and wherein the stopping of the operation of the second amplifier is performed in response to a power down signal being activated when the second auto-zero period ends and being deactivated when the first operation period starts.

13. The method of claim 11, further comprising:
controlling a power current of the analog-to-digital converting circuit by using the second output signal,
wherein the controlling of the power current is performed during at least one operation period of the first operation period and the second operation period.

14. The method of claim 13, wherein the controlling of the power current includes:
outputting a feedback signal based on the second output signal and a feedback enable signal; and
allowing the power current not to flow, in response to the feedback signal.

15. A circuit which charges a capacitor in response to an auto-zero signal in an auto-zero period and generates an output signal in an operation period, the circuit comprising:
a first transistor configured to provide a power supply voltage to a first output node from which the output signal is output;
a second transistor connected to the capacitor through a bias node, and configured to turn on in response to the auto-zero signal;
a current source connected to the first transistor through the first output node, connected to the capacitor and the second transistor through the bias node, and configured to generate a power current based on a voltage level of the bias node, which is maintained by the capacitor; and
a third transistor connected to the first transistor, and configured to provide the power supply voltage to the first transistor and turn off in response to a power down signal such that an operation of the circuit is stopped,
wherein, when the operation of the circuit is stopped the circuit is configured such that the third transistor blocks providing a power supply voltage to the first transistor in response to the power down signal.

16. The circuit of claim 15, wherein the third transistor is configured to:
turn off in response to the power down signal being activated when the auto-zero period ends, and
turn on in response to the power down signal being deactivated when the operation period starts,
wherein a length of the auto-zero period is determined based on a time taken for the capacitor to be fully charged, and
wherein the operation of the circuit is stopped from a time point at which the auto-zero period ends to a time point at which the operation period starts.

17. The circuit of claim 15, wherein the first transistor and the third transistor are PMOS transistors, and the second transistor is an NMOS transistor.

18. The circuit of claim 15, further comprising:
a feedback circuit connected to the first output node, and configured to receive the output signal, and to output a feedback signal; and
a fourth transistor connected to the current source through a second output node, and configured to connect the first output node to the second output node in response to the feedback signal.

19. The circuit of claim 18, wherein the feedback circuit includes a logic gate configured to output the feedback signal based on the output signal and a feedback enable signal, and wherein the fourth transistor is turned off in response to the feedback signal.

20. The circuit of claim 19, wherein the fourth transistor is an NMOS transistor, and the logic gate is a NAND gate.

* * * * *